(12) United States Patent
Chang et al.

(10) Patent No.: US 11,386,825 B2
(45) Date of Patent: Jul. 12, 2022

(54) MULTIPLEXER CIRCUIT AND DISPLAY PANEL HAVING THE MULTIPLEXER CIRCUIT

(71) Applicant: Au Optronics Corporation, Hsinchu (TW)

(72) Inventors: Che-Chia Chang, Hsinchu (TW); Ming-Hung Chuang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 184 days.

(21) Appl. No.: 16/831,775

(22) Filed: Mar. 26, 2020

(65) Prior Publication Data

US 2021/0166599 A1    Jun. 3, 2021

(30) Foreign Application Priority Data

Dec. 3, 2019  (TW) .................................. 108144122

(51) Int. Cl.
*G09G 3/20* (2006.01)
*H03K 17/693* (2006.01)

(52) U.S. Cl.
CPC ............. *G09G 3/20* (2013.01); *H03K 17/693* (2013.01); *G09G 2310/0297* (2013.01)

(58) Field of Classification Search
CPC ......... G09G 3/20; G09G 3/3275–3291; G09G 3/3685–3696; G09G 2310/0243; G09G 2310/0262; G09G 2310/0264; G09G 2310/027–0278; G09G 2310/0297; G09G 2320/0204; G09G 2320/0219; G09G 2320/0223; G09G 2320/0252; H03K 17/693

See application file for complete search history.

(56) References Cited

U.S. PATENT DOCUMENTS

| | | | |
|---|---|---|---|
| 9,721,491 B2 | 8/2017 | Pai | |
| 2014/0267218 A1 | 9/2014 | Pai | |
| 2015/0170564 A1* | 6/2015 | Kwon | G09G 3/3225 345/58 |
| 2017/0039972 A1* | 2/2017 | Li | G09G 3/20 |
| 2017/0345384 A1* | 11/2017 | Ma | G09G 3/20 |
| 2018/0108285 A1* | 4/2018 | Zhao | G09G 3/006 |
| 2018/0330653 A1* | 11/2018 | Zhou | G09G 3/20 |
| 2019/0325832 A1 | 10/2019 | Xi | |

FOREIGN PATENT DOCUMENTS

TW          201435846          9/2014

* cited by examiner

*Primary Examiner* — Nathan Danielsen
(74) *Attorney, Agent, or Firm* — JCIPRNET

(57) ABSTRACT

A multiplexer circuit and a display panel having the multiplexer circuit are provided. The multiplexer circuit includes a plurality of first transistors, a plurality of first control lines, a plurality of second control lines, a plurality of first transmission lines, and a plurality of second transmission lines. The first transistors are sequentially arranged along a first direction. The first control lines extend along the first direction and are disposed on a first side of the first transistors. The second control lines extend along the first direction and are disposed on a second side of the first transistors. The first transmission lines are respectively coupled between control terminals of a first group of the first transistors and the first control lines. The second transmission lines are respectively coupled to control terminals of a second group of the first transistors and the second control lines.

19 Claims, 5 Drawing Sheets

MULTIPLEXER CIRCUIT AND DISPLAY PANEL HAVING THE MULTIPLEXER CIRCUIT

CROSS-REFERENCE TO RELATED APPLICATION

This application claims the priority benefit of Taiwan patent application serial no. 108144122, filed on Dec. 3, 2019. The entirety of the above-mentioned patent application is hereby incorporated by reference here and made a part of this specification.

BACKGROUND

Technical Field

The disclosure relates to a multiplexer technology, and in particular, to a multiplexer circuit and a display panel having the same.

Description of Related Art

With the development of the semiconductor technology, resolution of a display panel is gradually improved, and data channels of the associated source driver are also gradually increased, which leads to an increase in the hardware cost of the source driver. In order to reduce the hardware cost of the source driver, a multiplexer circuit is introduced into the display panel, while the multiplexer circuit may bring about time delay or power consumption. Therefore, how to optimize the multiplexer circuit is an important issue of designing the display panel.

SUMMARY

The disclosure provides a multiplexer circuit and a display panel having the same, whereby an equivalent capacitance value of the multiplexer circuit may be reduced, so as to lower the power consumption resulting from the equivalent capacitance.

In an embodiment of the disclosure, a multiplexer circuit includes a plurality of first transistors, a plurality of first control lines, a plurality of second control lines, a plurality of first transmission lines, and a plurality of second transmission lines. The first transistors are sequentially arranged along a first direction, each of which has a first terminal, a second terminal, and a control terminal, wherein the first terminals of the first transistors are coupled to a plurality of source lines, and the second terminals of the first transistors are coupled to a source driver. The first control lines extend along the first direction and are disposed along a second direction perpendicular to the first direction on a first side of the first transistors. The second control lines extend along the first direction and are disposed along the second direction on a second side of the first transistors. The first transmission lines are respectively coupled between the control terminals of a first group of the first transistors and the first control lines. The second transmission lines are respectively coupled between the control terminals of a second group of the first transistors and the second control lines.

Based on the above, in the display panel and the multiplexer circuit provided in one or more embodiments of the disclosure, the first control lines and the second control lines are respectively disposed on two sides of the first transistors, so as to reduce points where the first transmission lines and the first control lines are interlaced and points where the second transmission lines and the second control lines are interlaced; as such, the equivalent capacitance value of the multiplexer circuit is reduced, and thereby the power consumption resulting from the equivalent capacitance is reduced.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
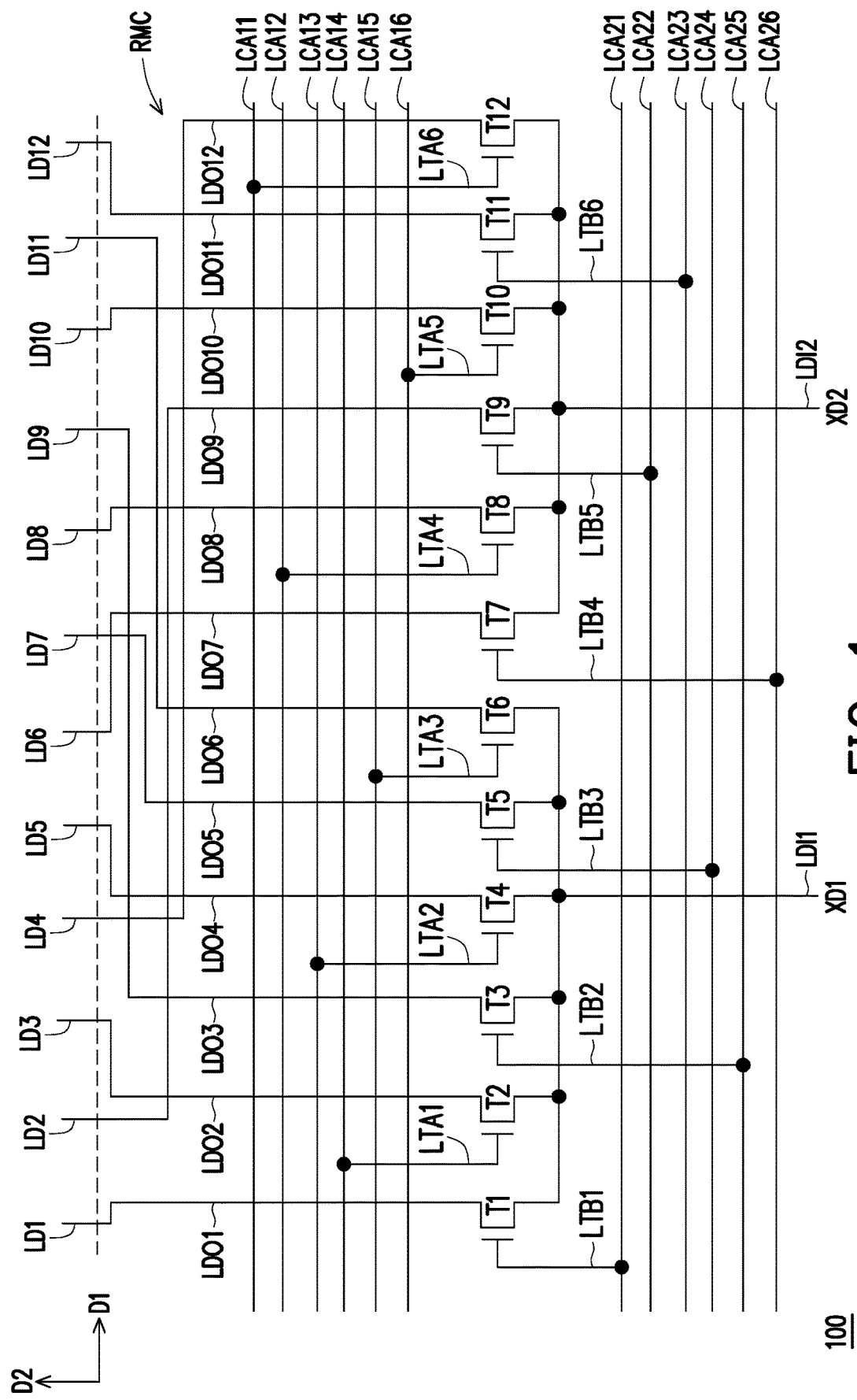
FIG. 1 is a schematic diagram of a multiplexer circuit according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Various embodiments of the disclosure are disclosed in the drawings, and for the sake of clarity, many of the practical details are set forth in the following description. However, it should be understood that these practical details should not be used to limit the disclosure. In other words, these practical details are not necessary in certain embodiments of the disclosure. In addition, to simplify the drawings, some conventional structures and elements in the drawings will be shown in a simple and schematic manner.

Throughout the specification, the same reference numerals in the accompanying drawings denote the same or similar elements. In the accompanying drawings, thicknesses of layers, films, panels, regions and so on are exaggerated for clarity. It should be understood that when an element such as a layer, film, region or substrate is referred to as being "on" or "connected to" another element, it can be directly on or connected to the other element, or intervening elements may also be present between said element and said another element. In contrast, when an element is referred to as being "directly on" or "directly connected to" another element, there are no intervening elements present between said element and said another element. As used herein, the term "connected" may refer to physically connected and/or electrically connected. Therefore, intervening elements may be present between two elements when the two elements are "electrically connected" or "coupled" to each other.

It should be understood that, although the terms "first", "second", etc., may be used herein to describe various elements, components, regions, layers and/or sections, these elements, components, regions, layers, and/or sections should not be limited by these terms. These terms are used to distinguish one element, component, region, layer or section from another element, component, region, layer or section.

The terminology used herein is for the purpose of describing particular embodiments and is not intended to be limiting of the disclosure. As used herein, the singular forms "a", "an" and "the" are intended to include the plural forms as well, unless the context clearly indicates otherwise. Herein, "or" represents "and/or". The term "and/or" used herein includes any or a combination of one or more of the associated listed items. It will be further understood that the terms "comprises", "comprising", "includes" and/or "comprising", when used herein, specify the presence of stated features, regions, integers, steps, operations, elements, and/or components, but do not preclude the presence or addition of one or more other features, regions, integers, steps, operations, elements, components, and/or groups thereof.

Moreover, relative terms such as "below" or "bottom" and "above" or "top" may serve to describe the relation between one element and another element in the text according to the illustration of the drawings. It should also be understood that the relative terms are intended to include different orientations of a device in addition to the orientation shown in the drawings. For example, if a device in the drawings is flipped, an element described as being disposed "below" other elements shall be re-orientated to be "above" other elements. Thus, the exemplary term "below" may cover the orientations of "below" and "above", depending on a specific orientation of the drawings. Similarly, if a device in a figure is flipped over, the element originally described to be located "below" or "underneath" other element is oriented to be located "on" the other element. Therefore, the illustrative term "under" or "below" may include orientations of "above" and "under".

The term "approximately" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "approximately" may mean within one or more standard deviations, or within, for example, ±30%, ±20%, ±15%, ±10%, ±5% of the stated value. Moreover, a relatively acceptable range of deviation or standard deviation may be chosen for the term "approximately" or "substantially" as used herein based on optical properties, etching properties or other properties, instead of applying one standard deviation across all the properties.

Unless otherwise defined, all terms (comprising technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

FIG. 1 is a schematic diagram of a multiplexer circuit according to an embodiment of the disclosure. With reference to FIG. 1, in this embodiment, a multiplexer circuit 100 includes at least one re-corresponding circuit RMC, a plurality of data output lines LDO1-LDO12, a plurality of first control lines LCA11-LCA16, a plurality of first transistors T1-T12, a plurality of first transmission lines LTA1-LTA6, a plurality of second transmission lines LTB1-LTB6, a plurality of second control lines LCA21-LCA26, and a plurality of data input lines LDI1-LDI2. The data input lines LDI1-LDI2 are configured to receive display voltages XD1 and XD2 from the source driver (e.g., 330 in FIG. 5).

The first transistors T1-T12 are sequentially arranged along a first direction D1, and each of the first transistors T1-T12 has a first terminal, a second terminal, and a control terminal. The first terminals of the first transistors T1-T12 are coupled to the source lines LD1-LD12 through the data output lines LDO1-LDO12 and the re-corresponding circuit RMC; that is, the data output lines LDO1-LDO12 are coupled between the first terminals of the first transistors T1-T12 and the re-corresponding circuit RMC, and the re-corresponding circuit RMC couples (or electrically connects) the data output lines LDO1-LDO12 to the corresponding source lines LD1-LD12 through traces and vias. In addition, the second terminals of the first transistors T1-T12 are coupled to the source driver (e.g., 330 in FIG. 5) through the data input lines LDI1-LDI2; that is, the data input lines LDI1-LDI2 are coupled between the second terminals of the first transistors T1-T12 and the source driver (e.g., 330 in FIG. 5).

The first control lines LCA11-LCA16 extend along the first direction D1 and are disposed along a second direction D2 perpendicular to the first direction D1 on a first side of the first transistors T1-T12 (e.g., one side at the first terminals of the first transistors T1-T12). The first transmission lines LTA1-LTA6 are respectively coupled between the control terminals of a first group of the first transistors T1-T12 (e.g., the even-numbered first transistors T2, T4, . . . , and T12) and the first control lines LCA11-LCA16.

The second control lines LCA21-LCA26 extend along the first direction D1 and are disposed along the second direction D2 on a second side of the first transistors T1-T12 (e.g., one side at the second terminals of the first transistors T1-T12). The second transmission lines LTB1-LTB6 are respectively coupled between the control terminals of a second group of the first transistors (e.g., the odd-numbered first transistors T1, T3, . . . , and T11) and the second control lines LCA21-LCA26. According to the above, points where the first transmission lines LTA1-LTA6 and the second transmission lines LTB1-LTB6 and the first control lines LCA11-LCA16 and the second control lines LCA21-LCA26 are interlaced may be reduced, so as to reduce the equivalent capacitance value of the multiplexer circuit 100 and thereby reduce the power consumption resulting from the equivalent capacitance.

In this embodiment, the number of the first transistors T1-T12 is a multiple of the number of the data input lines LDI1-LDI2 (e.g., 1:6), and the data output lines LDO1-LDO12 coupled to the first terminals of the first transistors T1-T12 are coupled to the corresponding source lines LD1-LD12 through the re-corresponding circuit RMC. Here, the source lines LD1-LD12 coupled to the adjacent first transistors T1-T12 are not adjacent to each other.

Figure 2:
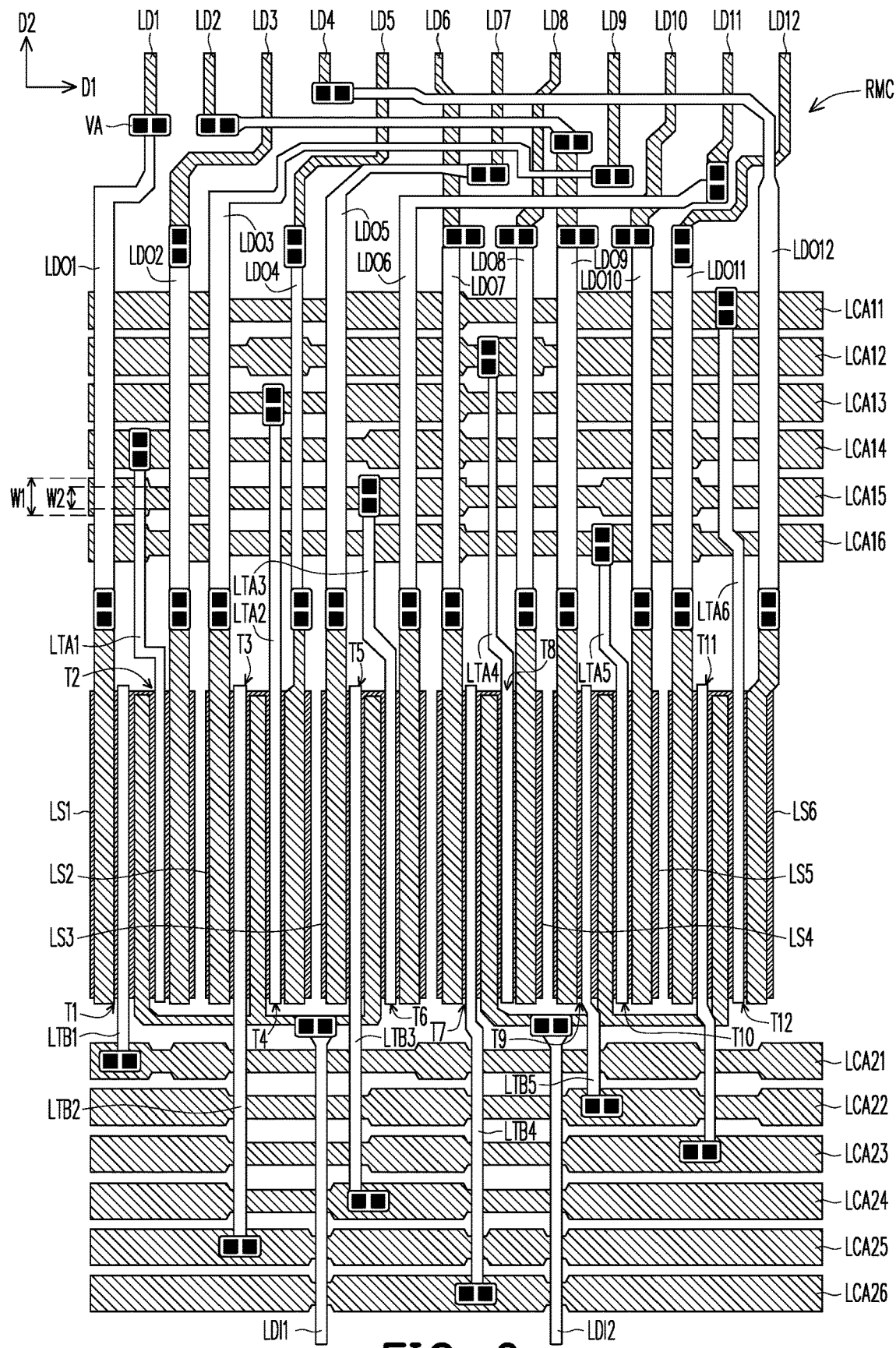
FIG. 2 is a schematic diagram of a layout of a multiplexer circuit according to an embodiment of the disclosure.

FIG. 2 is a schematic diagram of a layout of a multiplexer circuit according to an embodiment of the disclosure. As shown in FIG. 1 and FIG. 2, in the embodiment, the data output lines LDO1-LDO12 are located at a first conductive layer (herein represented by hollow lines), the source lines LD1-LD12 are located at a second conductive layer (herein represented by slashes), and the re-corresponding circuit RMC is at least coupled to the data output lines LDO1-LDO12 and the corresponding source lines LD1-LD12 through the vias VA.

Line widths of the first control lines LCA11-LCA16 along the second direction D2 are alternately set as a first line width W1 and a second line width W2 which is smaller than the first line width W1. In an embodiment of the disclosure, the first transmission lines LTA1-LTA6 respectively interlace the first control lines LCA11-LCA16, and at least one of the first control lines LCA11-LCA16 interlacing the corresponding first transmission lines LTA1-LTA6 has the second line width W2; for instance, the first transmission line LTA6 interlaces the first control lines LCA14-LCA16 having the second line width W2, but the first transmission line LTA6 interlaces the first control lines LCA12-LCA13 having the first line width W1. In an embodiment of the disclosure, the first transmission lines LTA1-LTA6 respectively interlace the first control lines LCA11-LCA16, and all of the first control lines LCA11-LCA16 interlacing the corresponding first transmission lines LTA1-LTA6 have the second line width W2, as shown by the first transmission lines LTA2 and LTA4.

In an embodiment of the disclosure, each of the first transmission lines LTA1-LTA6 interlaces a certain number of the first control lines LCA11-LCA16, when the number of the first control lines LCA11-LCA16 interlacing the respective first transmission lines LTA1-LTA6 is greater than or equal to a critical value, at least one of the first control lines LCA11-LCA16 interlacing the respective first transmission lines LTA1-LTA6 has the second line width W2, and when the number of the first control lines LCA11-LCA16 interlacing the respective first transmission lines LTA1-LTA6 is less than the critical value, all of the first control lines LCA11-LCA16 interlacing the first transmission lines LTA1-LTA6 have the first line width W1. If the critical value is assumed to be half the number of the first control lines LCA11-LCA16 (i.e., 6/2=3), the first transmission lines LTA1 and LTA3 interlace the corresponding first control lines LCA15 and LCA16 having the first line width W1, and some or all of the first control lines LCA12-LCA16 correspondingly interlacing the first transmission lines LTA2, LTA4, and LTA6 have the second line width W2.

The first control lines LCA11-LCA16 may, optionally with the first line width W1 or the second line width W2, interlace the data output lines LDO1-LDO12. In addition, two adjacent first transistors of the first transistors T1-T12 may share one semiconductor layer (e.g., semiconductor layers LS1-LS6 represented by backslashes) and one conductive wire at the second terminals. For instance, the first transistors T1 and T2 share the same semiconductor layer LS1 and the same conductive wire at the second terminals, and the first transistors T3 and T4 share the same semiconductor layer LS2 and the same conductive wire at the second terminals.

Line widths of the second control lines LCA21-LCA26 along the second direction D2 are alternately set as the first line width W1 and the second line width W2 smaller than the first line width W1, the second transmission lines LTB1-LTB6 respectively interlace the second control lines LCA21-LCA26, and all of the second control lines LCA21-LCA26 interlacing the corresponding second transmission lines LTB1-LTB6 have the second line width W2. However, in an embodiment of the disclosure, at least one of the second control lines LCA21-LCA26 interlacing the corresponding second transmission lines LTB1-LTB6 has the second line width W2. Alternatively, each of the second transmission lines LTB1-LTB6 interlaces a certain number of the second control lines LCA21-LCA26, when the number of the second control lines LCA21-LCA26 interlacing the respective second transmission lines LTB1-LTB6 is greater than or equal to the critical value, at least one of the second control lines LCA21-LCA26 interlacing the respective second transmission lines LTB1-LTB6 has the second line width W2, and when the number of the second control lines LCA21-LCA26 interlacing the respective second transmission lines LTB1-LTB6 is less than the critical value, all of the second control lines LCA21-LCA26 interlacing the second transmission lines LTB1-LTB6 have the first line width W1, which may be determined according to the circuit design and should not be construed as limitations in the disclosure.

In an embodiment of the disclosure, the data input lines LDI1-LDI2 interlace the second control lines LCA21-LCA26 having the second line width W2.

According to the above, by reducing the line widths of interlaced regions, the overlapped circuit area may be reduced, so as to lower the equivalent capacitance value of the multiplexer circuit 100 and further reduce the power consumption resulting from the equivalent capacitance.

Figure 3:
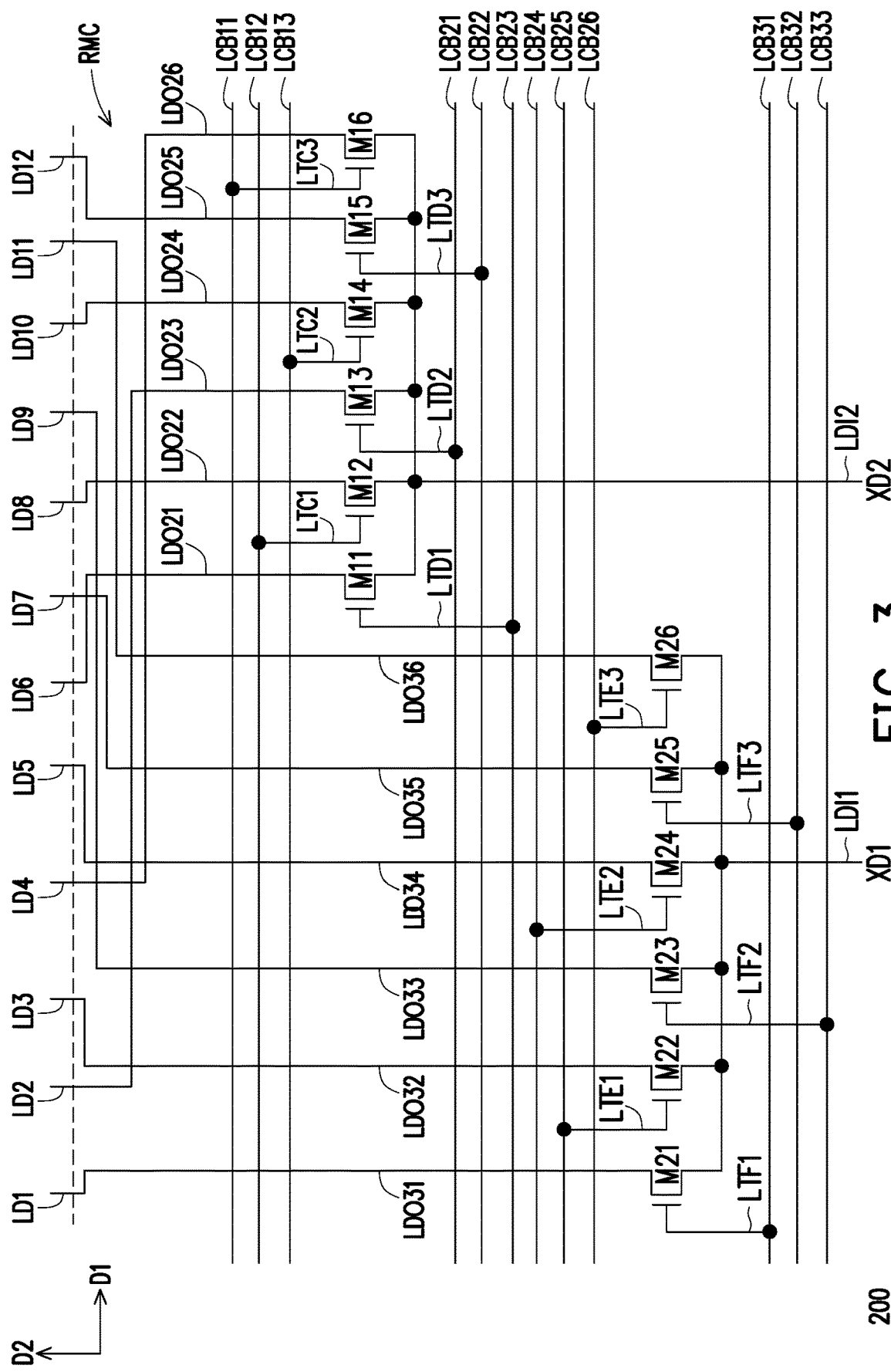
FIG. 3 is a schematic diagram of a multiplexer circuit according to another embodiment of the disclosure.

FIG. 3 is a schematic diagram of a multiplexer circuit according to another embodiment of the disclosure. As shown in FIG. 3, in this embodiment, the multiplexer circuit 200 includes at least one re-corresponding circuit RMC, a plurality of data output lines LDO21-LDO26 and LDO31-LDO36, a plurality of first control lines LCB11-LCB13, a plurality of first transistors M11-M16, a plurality of first transmission lines LTC1-LTC3, a plurality of second transmission lines LTD1-LTD3, a plurality of second control lines LCB21-LCB26, a plurality of second transistors M21-M26, a plurality of third transmission lines LTE1-LTE3, a plurality of fourth transmission lines LTF1-LTF3, a plurality of third control lines LCB31-LCB33, and a plurality of data input lines LDI1-LDI2. Here, the descriptions of the re-corresponding circuit RMC, the data output lines LDO21-LDO26 and LDO31-LDO36, and the data input lines LDI1-LDI2 may be found in the embodiment depicted in FIG. 1 and will not be repeated hereinafter. In addition, each of the first transistors M11-M16 and the second transistors M21-M26 has a first terminal, a second terminal, and a control terminal, respectively.

Figure 5:
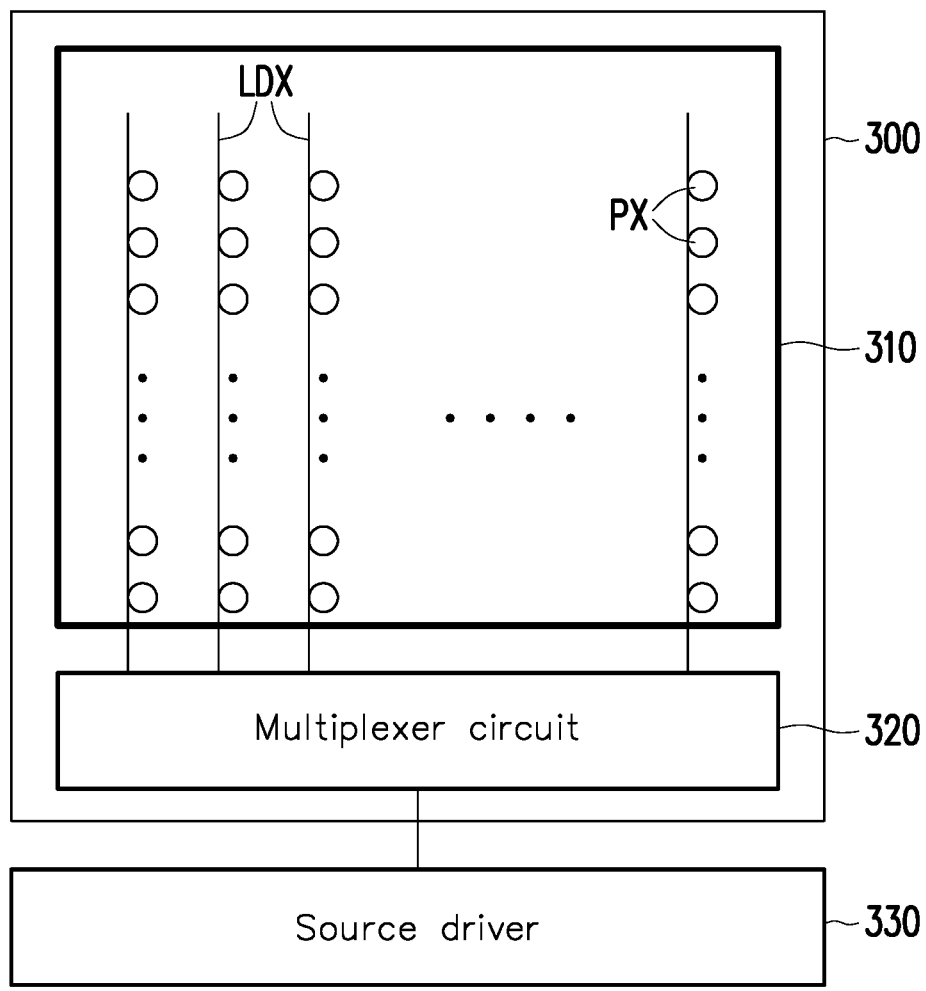
FIG. 5 is a schematic diagram of a circuit of a display panel according to an embodiment of the disclosure.

The first transistors M11-M16 are sequentially arranged along the first direction D1, the first terminals of the first transistors M11-M16 are coupled to the source lines LD6-LD12 through the data output lines LDO21-LDO26 and the re-corresponding circuit RMC, and the second terminals of the first transistors T1-T12 are coupled to the source driver through the data input line LDI2 (e.g., 330 in FIG. 5).

The first control lines LCB11-LCB13 extend along the first direction D1 and are disposed along the second direction D2 perpendicular to the first direction D1 on the first side of the first transistors M11-M16 (e.g., one side at the first terminals of the first transistors M11-M16). The first transmission lines LTC1-LTC3 are respectively coupled between the control terminals of the first group of the first transistors M11-M16 (e.g., the even-numbered first transistors M12, M14, and M16) and the first control lines LCB11-LCB13.

The second control lines LCB21-LCB26 extend along the first direction D1 and are disposed along the second direction D2 between the second side of the first transistors M11-M16 (e.g., one side at the second terminals of the first transistors M11-M16) and the third side of the second transistors M21-M26 (e.g., the side at the first terminals of the second transistors M21-M26). The second transmission lines LTD1-LTD3 are respectively coupled between the control terminals of the second group of the first transistors (e.g., the odd-numbered first transistors M11, M13, and M15) and the second control lines LCA21-LCA23.

The second transistors M21-M26 are sequentially arranged along the first direction D1, the first terminals of the second transistors M21-M26 are coupled to the source lines LD1-LD12 through the data output lines LDO31-LDO36, and the second terminals of the second transistors M21-M26 are coupled to the source driver through the data input line LDI1 (e.g., 330 in FIG. 5).

The third transmission lines LTE1-LTE3 are respectively coupled between the control terminals of the third group of the second transistors M21-M26 (e.g., the even-numbered second transistors M22, M24, and M26) and the second control lines LCA24-LCA26. Here, the second control lines LCA24-LCA26 coupled to the third transmission lines LTE1-LTE3 are different from the second control lines LCA21-LCA23 coupled to the second transmission lines LTD1-LTD3, the second transmission lines LTD1-LTD3 and the second control lines LCA24-LCA26 coupled to the third transmission lines LTE1-LTE3 are not interlaced, and the third transmission lines LTE1-LTE3 and the second control lines LCA21-LCA23 coupled to the second transmission lines LTD1-LTD3 are not interlaced.

The third control lines LCB31-LCB33 extend along the first direction D1 and are disposed along the second direction D2 on the fourth side of the second transistors M21-M26 (e.g., a side at the second terminals of the second transistors M21-M26); that is, the second transistors M21-M26 are disposed between the second control lines LCA21-LCA26 and the third control lines LCB31-LCB33. The fourth transmission lines LTF1-LTF3 are respectively coupled between the control terminals of the fourth group of the second transistors M21-M26 (e.g., the odd-numbered second transistors M21, M23, and M25) and the third control lines LCB31-LCB33.

According to the above, the points where the first transmission lines LTC1-LTC3, the second transmission lines LTD1-LTD3, the third transmission lines LTE1-LTE3, and the fourth transmission lines LTF1-LTF3 and the first control lines LCB11-LCB13, the second control lines LCB21-LCB26, and the third control lines LCB31-LCB33 are interlaced may be reduced, so as to lower the equivalent capacitance value of the multiplexer circuit 200 and further reduce the power consumption resulting from the equivalent capacitance.

In this embodiment, the number of the first transistors M11-M16 and the second transistors M21-M26 is a multiple of the number of the data input lines LDI1-LDI2 (e.g., 1:6).

Figure 4:
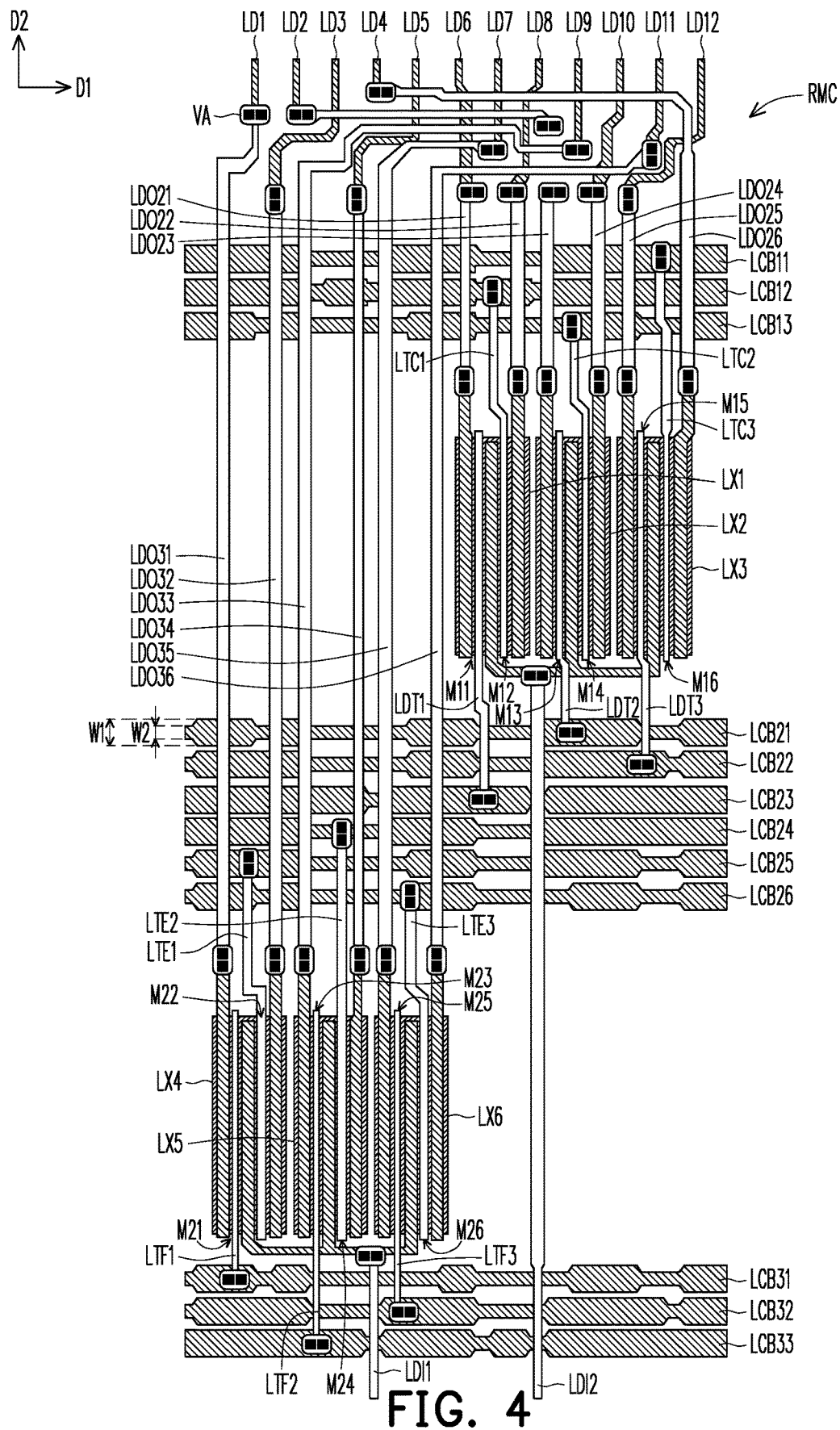
FIG. 4 is a schematic diagram of a layout of a multiplexer circuit according to another embodiment of the disclosure.

FIG. 4 is a schematic diagram of a layout of a multiplexer circuit according to another embodiment of the disclosure. Please refer to FIG. 2, FIG. 3, and FIG. 4, and what is shown in FIG. 4 may be referred to the embodiment depicted in FIG. 2. In this embodiment, the line widths of the first control lines LCB11-LCB13 along the second direction D2 is alternately set as the first line width W1 and the second line width W2 which is smaller than the first line width W1. In an embodiment of the disclosure, the first transmission lines LTC1-LTC3 respectively interlace the first control lines LCB11-LCB13, and at least one of the first control lines LCB11-LCB13 interlacing the corresponding first transmission lines LTC1-LTC3 has the second line width W2, as shown by the first transmission lines LTC1 and LTC3. In an embodiment of the disclosure, the first transmission lines LTC1-LTC3 respectively interlace the first control lines LCB11-LCB13, and all of the first control lines LCB11-LCB13 interlacing the corresponding first transmission lines LTC1-LTC3 have the second line width W2. In an embodiment of the disclosure, each of the first transmission lines LTC1-LTC3 interlaces a certain number of the first control lines LCB11-LCB13, when the number of the first control lines LCB11-LCB13 interlacing the respective first transmission lines LTC1-LTC3 is greater than or equal to the critical value, at least one of the first control lines LCB11-LCB13 interlacing the respective first transmission lines LTC1-LTC3 has the second line width W2, and when the number of the first control lines LCB11-LCB13 interlacing the respective first transmission lines LTC1-LTC3 is less than the critical value, all of the first control lines LCB11-LCB13 interlacing the first transmission lines LTC1-LTC3 have the first line width W1. The critical value is, for instance, half the number of the first control lines LCB11-LCB13 (i.e., 3/2=1.5).

The first control lines LCB11-LCB13 may, optionally with the first line width W1 or the second line width W2, interlace the data output lines LDO21-LDO26 and LDO31-LDO36. In addition, two adjacent first transistors of the first transistors M11-M16 may share the same semiconductor layer (e.g., semiconductor layers LX1-LX3) and one conductive wire at the second terminals; for instance, the first transistors M11 and M12 share the same semiconductor layer LX1 and the same conductive wire at the second terminals, and the first transistors M13 and M14 share the same semiconductor layer LX2 and the same conductive wire at the second terminals.

Line widths of the second control lines LCB21-LCB26 along the second direction D2 are alternately set as the first line width W1 and the second line width W2 smaller than the first line width W1, the second transmission lines LTD1-LTD3 respectively interlace the second control lines LCB21-LCB26, and all of the second control lines LCB21-LCB26 interlacing the corresponding second transmission lines LTD1-LTD3 have the second line width W2. In an embodiment of the disclosure, at least one of the second control lines LCB21-LCB23 interlacing the corresponding second transmission lines LTD1-LTD3 has the second line width W2. Alternatively, each of the second transmission lines LTD1-LTD3 interlaces a certain number of the second control lines LCB21-LCB23, when the number of the second control lines LCB21-LCB23 interlacing the respective second transmission lines LTD1-LTD3 is greater than or equal to the critical value, at least one of the second control lines LCB21-LCB23 interlacing the respective second transmission lines LTD1-LTD3 has the second line width W2, and when the number of the second control lines LCB21-LCB23 interlacing the respective second transmission lines LTD1-LTD3 is less than the critical value, all of the second control lines LCB21-LCB23 interlacing the second transmission lines LTD1-LTD3 have the first line width W1.

In the embodiment of the disclosure, the third transmission lines LTE1-LTE3 respectively interlace the second control lines LCB24-LCB26, and at least one of the second control lines LCB24-LCB26 interlacing the corresponding third transmission lines LTE1-LTE3 has the second line width W2. Alternatively, the third transmission lines LTE1-LTE3 respectively interlace the second control lines LCB24-LCB26, and all of the second control lines LCB24-LCB26 interlacing the corresponding third transmission lines LTE1-LTE3 have the second line width W2. In another alternative embodiment, each of the third transmission lines LTE1-LTE3 interlaces a certain number of the second control lines, when the number of the second control lines LCB24-LCB26 interlacing the respective third transmission lines LTE1-LTE3 is greater than or equal to the critical value, at least one of the second control lines LCB24-LCB26 interlacing the respective third transmission lines LTE1-LTE3 has the second line width W2, and when the number of the second control lines LCB24-LCB26 interlacing the respective third transmission lines LTE1-LTE3 is less than the critical value, all of the second control lines LCB24-LCB26 interlacing the third transmission lines LTE1-LTE3 have the first line width W1.

The second control lines LCB21-LCB26 may, optionally with the first line width W1 or the second line width W2, interlace the data output lines LDO21-LDO26. Moreover, two adjacent second transistors of the second transistors M21-M26 may share the same semiconductor layer (e.g., semiconductor layers LX4-LX6) and one conductive wire at the second terminals. For instance, the second transistors M21 and M22 share the same semiconductor layer LX4 and the same conductive wire at the second terminals, and the second transistors M23 and M24 share the same semiconductor layer LX4 and the same conductive wire at the second terminals.

Line widths of the third control lines LCB31-LCB33 along the second direction D2 are alternately set as the first line width W1 and the second line width W2 smaller than the first line width W1; the fourth transmission lines LTF1-LTF3 respectively interlace the third control lines LCB31-LCB33, and all of the third control lines LCB31-LCB33 interlacing the corresponding fourth transmission lines LTF1-LTF3 have the second line width W2. In an embodiment of the disclosure, at least one of the third control lines LCB31-LCB33 interlacing the corresponding fourth transmission lines LTF1-LTF3 has the second line width W2. Alternatively, each of the fourth transmission lines LTF1-LTF3 interlaces a certain number of the third control lines LCB31-LCB33, when the number of the third control lines LCB31-LCB33 interlacing the respective fourth transmission lines LTF1-LTF3 is greater than or equal to the critical value, at least one of the third control lines LCB31-LCB33 interlacing the respective fourth transmission lines LTF1-LTF3 has the second line width W2, and when the number of the third control lines LCB31-LCB33 interlacing the respective fourth transmission lines LTF1-LTF3 is less than the critical value, all of the third control lines LCB31-LCB33 interlacing the fourth transmission lines LTF1-LTF3 have the first line width W1.

In the embodiment of the disclosure, all of the second control lines LCB21-LCB26 and/or the third control lines LCB31-LCB33 interlacing the data input lines LDI1-LDI2 have the second line width W2. In addition, the line widths of the third control lines LCB31-LCB33 intersecting the data input line LDI2 along the first direction D1 may be further reduced.

According to the above, by reducing the line widths of the interlaced regions, the overlapped circuit area may be reduced, so as to lower the equivalent capacitance value of the multiplexer circuit 200 and further reduce the power consumption resulting from the equivalent capacitance.

FIG. 5 is a schematic diagram of a circuit of a display panel according to an embodiment of the disclosure. With reference to FIG. 5, a display panel 300 provided in the embodiment includes a pixel array 310 and a multiplexer circuit 320. The pixel array 310 has a plurality of source lines LDX and a plurality of pixel PXs arranged in an array. The multiplexer circuit 320 is coupled between the pixel array 310 and the source driver 330, and the multiplexer circuit 320 may be referred to as the multiplexer circuits 100 and 200 shown in FIG. 1 to FIG. 4.

To sum up, in the display panel and the multiplexer circuit provided in one or more embodiments of the disclosure, the first control lines and the second control lines are respectively disposed on two sides of the first transistors, so as to reduce the points where the first transmission lines and the first control lines are interlaced and the points where the second transmission lines and the second control lines are interlaced; as such, the equivalent capacitance value of the multiplexer circuit is lowered, and thereby the power consumption resulting from the equivalent capacitance is reduced. In addition, by reducing the line widths of the first control lines and the second control lines intersecting the first transmission lines and the second transmission lines, the overlapped circuit area may be reduced, so as to lower the equivalent capacitance value of the multiplexer circuit and further reduce the power consumption resulting from the equivalent capacitance.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:
1. A multiplexer circuit comprising:
a plurality of data input lines;
a plurality of first transistors sequentially arranged along a first direction and each having a first terminal, a second terminal, and a control terminal, wherein the first terminals of the first transistors are coupled to a plurality of source lines, and the second terminals of the first transistors are coupled to a source driver through the plurality of data input lines;
a plurality of first control lines extending along the first direction and disposed on a first side of the first transistors along a second direction perpendicular to the first direction;
a plurality of second control lines extending along the first direction and disposed on a second side of the first transistors along the second direction;
a plurality of first transmission lines respectively coupled between the control terminals of a first group of the first transistors and the first control lines;
a plurality of second transmission lines respectively coupled between the control terminals of a second group of the first transistors and the second control lines;
a plurality of second transistors sequentially arranged along the first direction, the second control lines being disposed along the second direction between the first control transistors and the second transistors, wherein each of the second transistors has a first terminal, a second terminal, and a control terminal, the first terminals of the second transistors are coupled to the source lines, and the second terminals of the second transistors are coupled to the source driver;
a plurality of third control lines extending along the first direction, the second transistors being disposed along the second direction between the second control lines and the third control lines;
a plurality of third transmission lines respectively coupled between the control terminals of a third group of the second transistors and the second control lines; and
a plurality of fourth transmission lines respectively coupled between the control terminals of a fourth group of the second transistors and the third control lines,
wherein a terminal of each of the plurality of data input lines is coupled to two or more of the second terminals of the first transistors at a connection point, and the each of the plurality of data input lines extends from the connection point to the source driver over all of the plurality of second control lines along the second direction.

2. The multiplexer circuit according to claim 1, wherein line widths of the first control lines along the second direction are alternately set as a first line width and a second line width smaller than the first line width.

3. The multiplexer circuit according to claim 2, wherein the first transmission lines respectively interlace the first control lines, and at least one of the first control lines interlacing the corresponding first transmission lines has the second line width.

4. The multiplexer circuit according to claim 2, wherein the first transmission lines respectively interlace the first control lines, and all of the first control lines interlacing the corresponding first transmission lines have the second line width.

5. The multiplexer circuit according to claim 2, wherein each of the first transmission lines interlaces a certain number of the first control lines, when the number of the first control lines interlacing the respective first transmission lines is greater than or equal to a critical value, at least one of the first control lines interlacing the respective first transmission lines has the second line width, and when the number of the first control lines interlacing the respective first transmission lines is less than the critical value, all of the first control lines interlacing the first transmission lines have the first line width.

6. The multiplexer circuit according to claim 1, wherein line widths of the second control lines along the second direction are alternately set as a first line width and a second line width smaller than the first line width.

7. The multiplexer circuit according to claim 6, wherein the second transmission lines respectively interlace the second control lines, and at least one of the second control lines interlacing the corresponding second transmission lines has the second line width.

8. The multiplexer circuit according to claim 6, wherein the second transmission lines respectively interlace the second control lines, and all of the second control lines interlacing the corresponding second transmission lines have the second line width.

9. The multiplexer circuit according to claim 6, wherein each of the second transmission lines interlaces a certain number of the second control lines, when the number of the second control lines interlacing the respective second transmission lines is greater than or equal to a critical value, at least one of the second control lines interlacing the respective second transmission lines has the second line width, and when the number of the second control lines interlacing the respective second transmission lines is less than the critical value, all of the second control lines interlacing the second transmission lines have the first line width.

10. The multiplexer circuit according to claim 6, further comprising:
a plurality of data input lines coupled between the second terminals of the first transistors and the source driver, wherein the number of the first transistors is a multiple of the number of the data input lines, and all of the second control lines respectively interlacing the data input lines have the second line width.

11. The multiplexer circuit according to claim 1, wherein the third transmission lines and the second control lines coupled to the second transmission lines are not interlaced.

12. The multiplexer circuit according to claim 11, wherein line widths of the second control lines along the second direction are alternately set as a first line width and a second line width smaller than the first line width.

13. The multiplexer circuit according to claim 12, wherein the third transmission lines respectively interlace the second control lines, and at least one of the second control lines interlacing the corresponding third transmission lines has the second line width.

14. The multiplexer circuit according to claim 13, wherein the third transmission lines respectively interlace the second control lines, and all of the second control lines interlacing the corresponding third transmission lines have the second line width.

15. The multiplexer circuit according to claim 12, wherein each of the third transmission lines interlaces a certain number of the second control lines, when the number of the second control lines interlacing the respective third transmission lines is greater than or equal to a critical value, at least one of the second control lines interlacing the respective third transmission lines has the second line width, and when the number of the second control lines interlacing the respective third transmission lines is less than the critical value, all of the second control lines interlacing the third transmission lines have the first line width.

16. The multiplexer circuit according to claim 1, wherein line widths of the third control lines along the second direction are alternately set as a first line width and a second line width smaller than the first line width.

17. The multiplexer circuit according to claim 16, wherein the fourth transmission lines respectively interlace the third control lines, and at least one of the third control lines interlacing the corresponding fourth transmission lines has the second line width.

18. The multiplexer circuit according to claim 16, wherein each of the fourth transmission lines interlaces a certain number of the third control lines, when the number of the third control lines interlacing the respective fourth transmission lines is greater than or equal to a critical value, at least one of the third control lines interlacing the respective fourth transmission lines has the second line width, and when the number of the third control lines interlacing the respective fourth transmission lines is less than the critical value, all of the third control lines interlacing the fourth transmission lines have the first line width.

19. A display panel comprising:
a pixel array having a plurality of source lines and a plurality of pixels arranged in an array; and
the multiplexer circuit according to claim 1, the multiplexer circuit being coupled between the pixel array and the source driver.

* * * * *